United States Patent [19]

Robson

[11] Patent Number: 5,509,088
[45] Date of Patent: Apr. 16, 1996

[54] METHOD FOR CONVERTING CCITT COMPRESSED DATA USING A BALANCED TREE

[75] Inventor: Thomas Robson, Penfield, N.Y.

[73] Assignee: Xerox Corporation, Stamford, Conn.

[21] Appl. No.: 161,492

[22] Filed: Dec. 6, 1993

[51] Int. Cl.⁶ .................................................. G06K 9/36
[52] U.S. Cl. ........................ 382/233; 382/240; 341/67
[58] Field of Search ............................. 382/56, 233, 240, 382/246; 358/427, 262.1; 341/65, 67; H04N 1/41

[56] References Cited

U.S. PATENT DOCUMENTS

| | | | |
|---|---|---|---|
| 3,777,066 | 12/1973 | Nicholas | 179/69.5 R |
| 3,813,485 | 5/1974 | Arps | 178/6.8 |
| 3,883,847 | 5/1975 | Frank | 340/146.1 R |
| 4,044,347 | 8/1977 | Van Voorhis | 340/347 DD |
| 4,559,563 | 12/1985 | Joiner, Jr. | 358/260 |
| 4,901,363 | 2/1990 | Toyokawa | 382/56 |
| 5,109,433 | 4/1992 | Notenboom | 382/56 |
| 5,151,949 | 9/1992 | Miyata | 382/56 |
| 5,253,053 | 10/1993 | Chu et al. | 382/56 |

OTHER PUBLICATIONS

D. A. Huffman, "A Method for the Construction of Minimum Redundancy Codes," Proc. of the IRE, v. 40, pp. 1098–1101, Sep. 1952.

Primary Examiner—Leo Boudreau
Assistant Examiner—Andrew W. Johns
Attorney, Agent, or Firm—Gary B. Cohen

[57] ABSTRACT

There is provided a method of processing an input data stream including compressed image data in which an extended tree, characterized by a plurality of words, is developed. Each word is associated with a token set and the words are corresponded with the token sets, respectively, by way of, for example, a look-up table. In practice, a sample word, representing a portion of the compressed image data, is sampled from the input data stream and matched with a selected one of the words from the tree to obtain the token set corresponding with the selected one of the words. The compressed image data portion is then processed in accordance with the obtained token set.

18 Claims, 6 Drawing Sheets

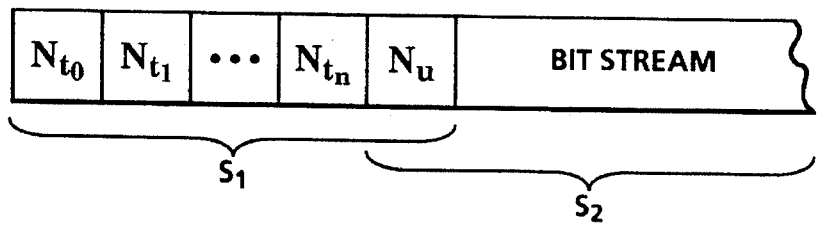
FIG. 8
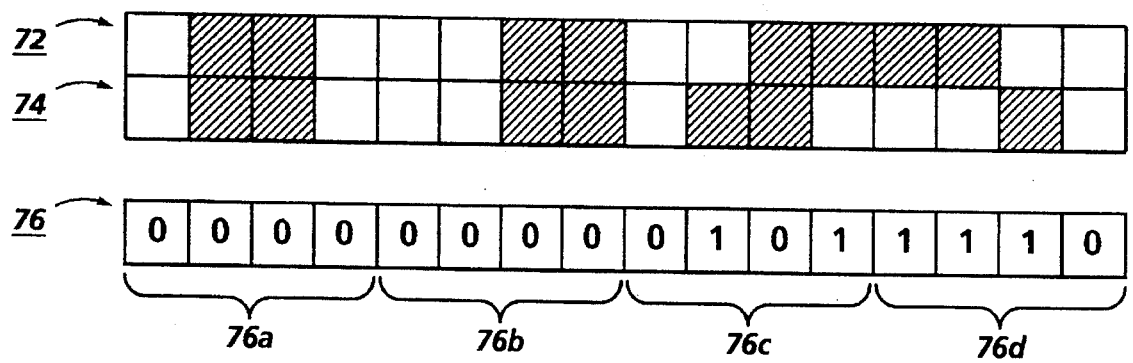
FIG. 9A
FIG. 9B
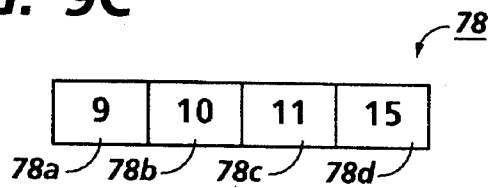
FIG. 9C

METHOD FOR CONVERTING CCITT COMPRESSED DATA USING A BALANCED TREE

The present invention relates generally to a technique for converting CCITT compressed data and, more particularly, to an approach for sampling a word in a stream of compressed data and using an extended Huffman tree to obtain a plurality of tokens from the sampled word. In another embodiment, a compressed format is produced from a change vector.

With the increased processing and storing of digital-based image data, there is a high demand for compressing such data. In compressing image data, encoding is employed to convert the image data into code words. Because such data is, in general, associated with a number of symbols, such as alphanumeric symbols, and because some symbols in a typical alphabet occur with great frequency, it has proven advantageous in reducing the average length of code words to use so-called statistical coding techniques for deriving signals of appropriate length to represent the individual symbols. An example of a variable length coding system is described in the prior art by such works as the following:

D. A. Huffman

"A Method for the Construction of

Minimum-Redundancy Codes"

Proc. of the IRE, v. 40, pp. 1098–1101

September, 1952

In the so-called Huffman compression/decompression scheme, code words or tokens are assigned to symbols or characters depending upon the probability of occurrence of each source symbol or character. Thus, the shorter code words are assigned to those characters which occur most often. In general, the length of the code word assigned to each symbol or character increases as the probability of occurrence of that symbol or character decreases.

In one example, symbols are encoded at one location and transmitted to a remote site, in the form of a stream of input data, for eventual decompression. Decompression of the image data can be performed in three stages:

1) Extract code words or tokens from the stream of input data;
2) Convert the tokens into a plurality of change vectors; and
3) Expand the change vectors into bitmaps for output of corresponding images.

Further general background regarding variable length coding techniques can be obtained by reference to the following U.S. patents:

U.S. Pat. No. 3,777,066

Patentee: Nicholas

Issued: Dec. 4, 1973

U.S. Pat. No. 3,883,847

Patentee: Frank

Issued: May 13, 1975

U.S. Pat. No. 4,044,347

Patentee: Van Voorhis

Issued: Aug. 23, 1977

A scheme for compressing digitally-based image data has been disclosed by Xerox® Corporation in the following reference:

Xerox System Integration Standard

"Raster Encoding Standard"

XNSS 178506

June, 1985

This compression scheme (which will hereinafter be referred to as "Xerox® compressed format") is based on predicting the value of a pixel based on the value of a predictor pixel elsewhere in the image. The position of this predictor pixel is either a fixed number of pixels back in the same scan-line, the pixel immediately above or a white pixel (this last technique is effectively unpredicted). If the pixel prediction is correct, a zero is written to an intermediate buffer otherwise a one is written. A "bitmap" is thus produced with size and dimensions the same as the original image. This resultant image is then compressed on a scanline basis using run lengths of zero nibbles. Tokens are produced based on the value of the run length and the terminating non-zero nibble. These tokens are encoded as either one, two, or three nibble data types and written to the output data vector.

By way of general background, with respect to adaptive compression techniques, references is made to the following U.S. patents:

U.S. Pat. No. 4,559,563

Patentee: Joiner, Jr.

Issued: Dec. 17, 1985

U.S. Pat. No. 4,901,363

Patentee: Toyokawa

Issued: Feb. 13, 1990

In the above-described Huffman decoding approach, a first token is decoded, by reference to an appropriate tree, and the remaining tokens are decoded, on a singular basis, until all of the corresponding change vectors are generated. It would be desirable to provide a technique in which multiple tokens are decoded at one time. Additionally, in converting compressed image data to Xerox® compressed format it is necessary to decompress the compressed image data and to then obtain the format from the decompressed image data. For purposes of increasing the rate of conversion of compressed image data to Xerox® compressed format it would be desirable to provide a technique in which Xerox® compressed format could be obtained from change vectors.

In accordance with the present invention, there is provided a method of processing an input data stream including compressed image data, including the steps of: providing a tree having a root and a plurality of link paths, each of which link path is associated with a token; extending each link path to form an extended tree with a plurality of extended link paths, each of the extended link paths being associated with a token set and representing a first word; corresponding the first words with their respective token sets; sampling the input data stream to obtain a sample word representing a portion of the compressed image data; matching the sample word with a selected one of the first words to obtain the token set corresponding with the selected one of the first words; and processing the compressed image data portion in accordance with the token set obtained by way of the matching step.

These and other aspects of the invention will become apparent from the following description, the description being used to illustrate a preferred embodiment of the invention when read in conjunction with the accompanying drawings.

FIG. 8 is a schematic representation illustrating a sampling technique used in the preferred decompressing technique;

FIG. 9A is a schematic view of two adjacent scanlines with black and white pixels;

FIG. 9B is a predictor scanline developed from the adjacent scanlines of FIG. 9A in accordance with Xerox® compressed format;

FIG. 9C is a change vector representing the predictor scanline of FIG. 9B; and

While the present invention will hereinafter be described in connection with a preferred embodiment thereof, it will be understood that it is not intended to limit the invention to that embodiment. On the contrary, it is intended to cover all alternatives, modifications and equivalents as may be included within the spirit and scope of the invention as defined by the appended claims.

Figure 1:
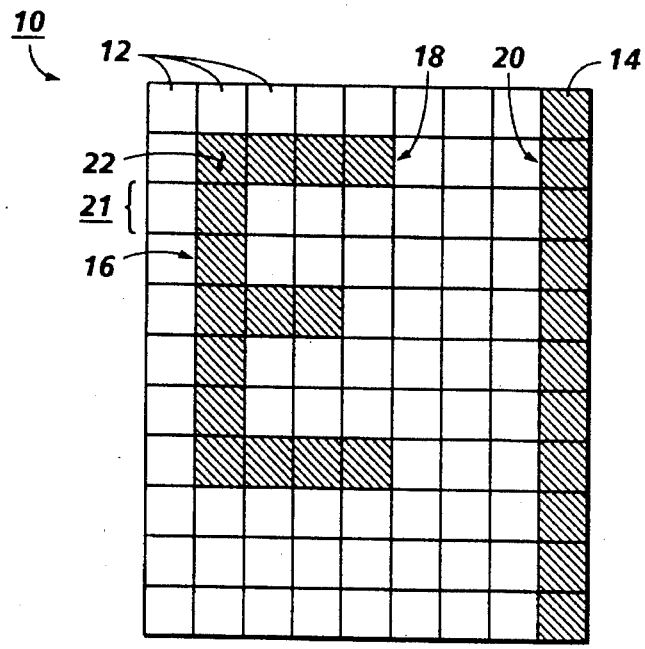
FIG. 1 is a prior art, schematic, elevational view of a plurality of black and white pixels configured to form an image of a character and a terminating column along a right edge.

Referring to FIG. 1, an image, represented by scanlines of black and white pixels, is used to briefly discuss the compression schemes referred to as "CCITT GP3" and "CCITT GP4" (hereinafter referred to conjunctively as "CCITT compression"). CCITT compression records changes in an image on a scan-line basis. The changes considered are changes in color from black to white and vice versa. Typically, the changes are recorded in two fashions, either by recording a change with respect to the same scan-line ("1D or run length encoding") or with respect to the nearest change in the previous scan-line ("2D encoding"). In the illustrated embodiment of FIG. 1, the first scanline, designated by the numeral 10, is characterized by eight consecutive white pixels, each designated by the numeral 12 followed by one black terminating pixel 14. It should be appreciated that scanline 10 and the column containing the pixel 14, are imaginary in that they are processor generated for the purpose of facilitating encoding and decoding processes. In the 1D encoding scheme, the scanline can be represented by the format "8W, 1B".

Edges 16, 18 and 20 can be employed to describe the third scan line 21 in terms of 2D encoding. In particular, the black pixel 22 is aligned with the edge 16 and is four pixels away from the edge 18. Moreover, the right-most black pixel is aligned with the edge 20. Accordingly, the third scanline can be described, in 2D encoding terms, as "0V, −3V, 0V". As is known, the CCITT GP4 compression scheme employs, to a great extent, 2D encoding because 2D encoding is viewed as the most efficient means by which to compress image data. While the technique described below is best suited for use with 2D encoding, it will be understood that this technique can be employed with both 1D and 2D encoding.

Figure 2:
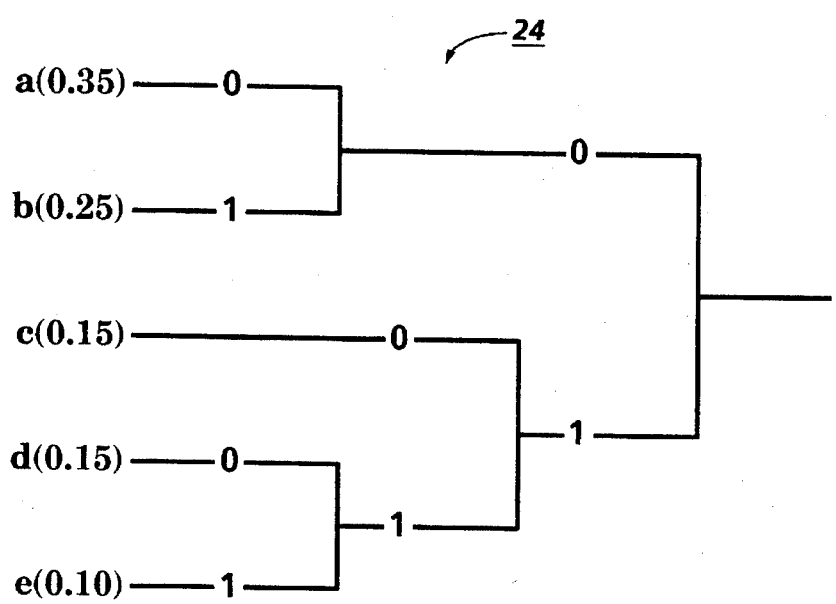
FIG. 2 is a prior art, schematic representation of an exemplary Huffman tree suitable for use in decoding variable length code words on the basis of the frequency in which they occur.

Either type of encoding produces a series of tokens, which are abstract forms requiring a real data representation. This representation is accomplished by building a Huffman tree for each of three classes of tokens: 2D tokens, white run length tokens and black run length tokens. Referring to FIG. 2, the theory underlying the conventional Huffman tree is discussed in further detail. It will be understood by those skilled in the art that while a Huffman tree used in CCITT compression is considerably more extensive than the illustrated tree(s) 24 employed in FIG. 2 or FIG. 3, the exemplary trees of FIGS. 2 and 3 serve to provide a basis for understanding the concepts underlying the use of the Huffman tree in the prior art and in the present disclosure. In the Huffman tree 24 (FIG. 2) various variable length code words are associated with a plurality of relative frequencies or tokens. In particular, the variable length words are represented by links and the tokens ("a", "b" and so on) are disposed at nodes referred to as "leaf nodes".

The output data obtained from CCITT compression is the simple concatenation of the variable length representations produced from the Huffman encoding. To decompress CCITT compressed data, in accordance with a prior art technique, the following stages are followed:

1/ Read a word from compressed input data;

2/ With the word, start at the root of the 1D or 2D tree and traverse the tree;

3/ Obtain a decoded token value upon reaching a leaf node;

4/ Repeat the above steps until one or more desired bitmaps are processed.

This prior art technique can be very time-consuming since a decision must be made for every bit of input data and input compression vectors can contain many hundreds of kilobytes of data.

Figure 3:
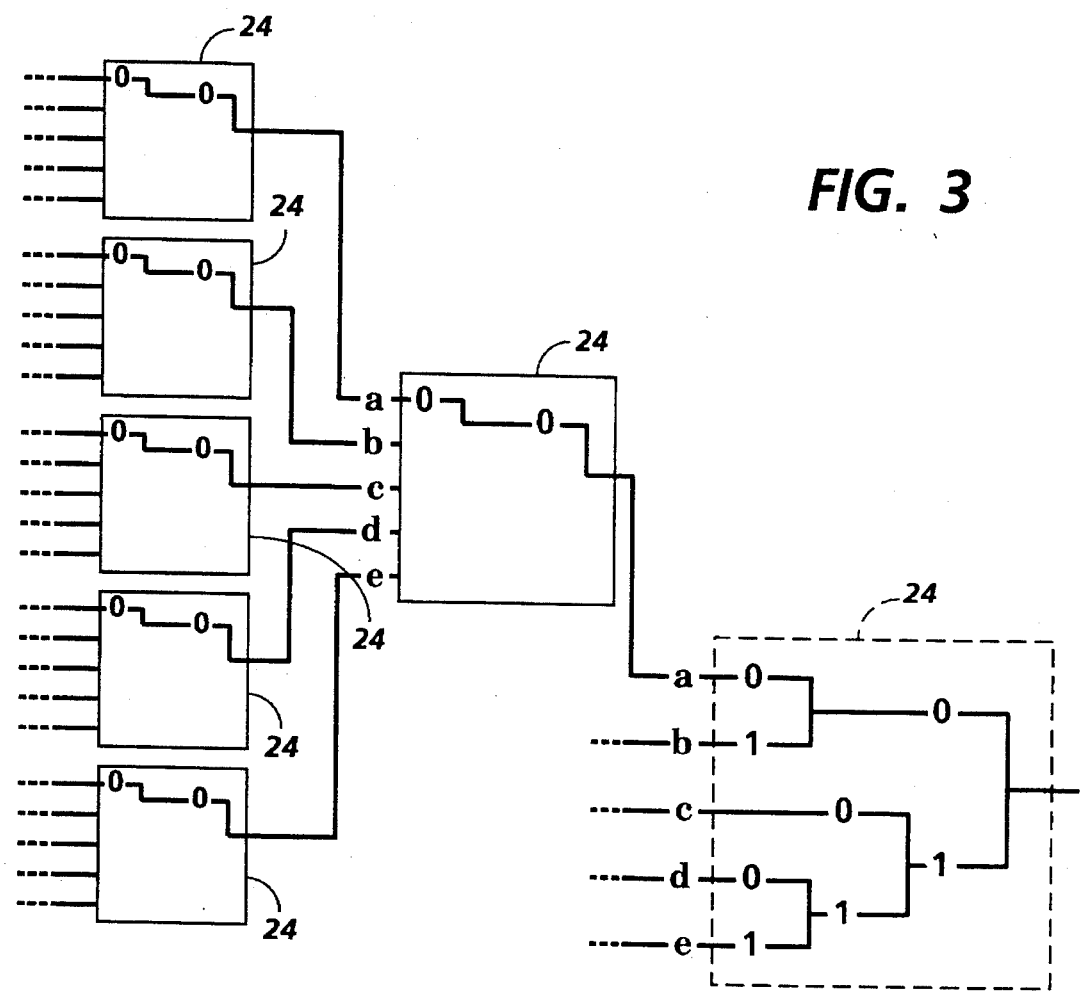
FIG. 3 is an exemplary extended Huffman tree constructed for use in the preferred decompressing technique of the present invention.

Referring to FIG. 3, in the preferred embodiment, an extended Huffman Tree, for use in decompressing image data, is developed by recursively adding copies of tree 24 (FIG. 2) onto unconnected leaf nodes until the shortest link path is equal to a preselected number of links. While the preselected number is preferably 16, the preselected number could be greater without affecting the basic concept upon which the preferred embodiment is based. In this supplemented tree, some link paths are longer than others. In turn, the supplemented tree is then trimmed, to form the extended tree, in which all of the paths from the root to all leaf nodes are sixteen links long.

To form a look-up table for the extended tree, each path is traversed from root to leaf node, and the values of the tokens encountered are recorded. As will be recognized many of the tokens which were once associated with leaf nodes will, in the extended tree, constitute internal nodes. In forming the look-up table, for any given link path, only the first six token values encountered are actually used in developing the table. Moreover, the number of links associated with the six token values is recorded. Whether the number of tokens recorded in a traversal is less than, equal to or greater than six, the number of links traversed in obtaining the recorded tokens is preferably recorded. In the extended tree, the leaf nodes can be enumerated with a number from 0 to 0XFFF.

In summary, the data gleaned from traversing each link path includes a 16 bit word, hereinafter referred to as a "node enumeration number", and up to six token values associated with that word. Additionally, a value, designated by the parameter "u" (FIG. 4A) represents the number of bits which are not used in obtaining the tokens.

In the case of developing a 1D look-up table from the extended tree, only one internal node is recorded as a terminal node and its token value is the run length represented by that path. Further understanding of the 1D case will appear from the discussion below.

Figure 4A:
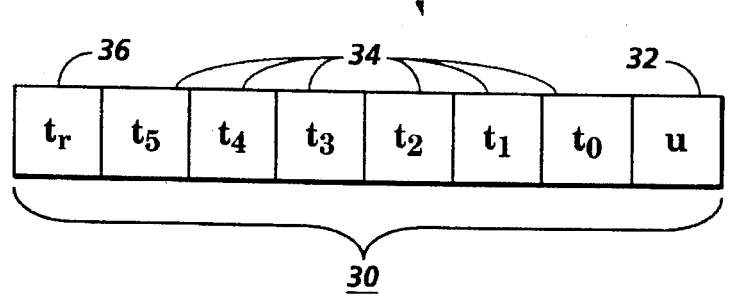
FIGS. 4A and 4B are schematic representations of multi-bit words obtained by traversing an extended tree of the type shown in FIG. 3.

Referring to FIG. 4A, further methodology for constructing the look-up table with the data obtained from the extended tree is discussed. A table of thirty two bit values is constructed from the new terminal nodes (i.e. the recorded token values) using the node enumeration numbers as indices into the table. More particularly, each line 26 of the look-up table includes a 32 bit word 30 divided into 8 nibble (4-bit) fields. It should be noted that the position of each 32 bit word of the look-up table corresponds to one of the node enumeration words or numbers of the extended Huffman tree of FIG. 3. In the first field 32 the value of u is designated, while the recorded tokens are designated in the fields 34. The tokens, which are represented arbitrarily by an integer selected from the values 0–15, represent actions to be taken with respect to a pixel in a corresponding bitmap. The action may include, among others, outputting the pixel to an output image, updating the current position of the pixel (e.g. moving pixel position down one scanline) or performing image processing on a pixel (e.g. resolution conversion). Further discussion, regarding the manner in which these actions are initiated, is discussed in further detail below. The final token in the word 30 serves as a return flag, and, as discussed below, causes the process to obtain more tokens. It should be recognized that the size of the fields 26 could be expanded or contracted depending on, among other factors, availability of memory.

Figure 4B:
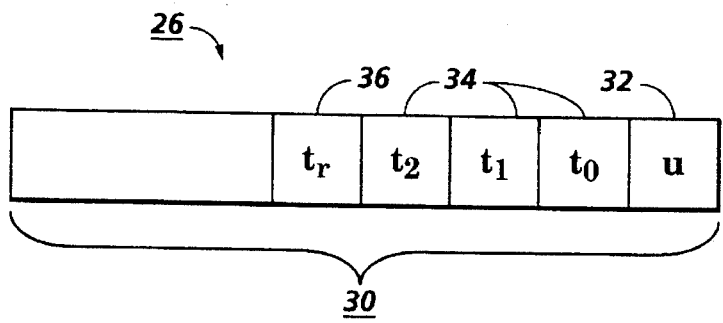

Referring to FIG. 4B, another exemplary line in the look-up table is shown. As shown by FIG. 4B, while the fields of word 30 can contain up to six token values, in some instances, the word 30 may contain less than six token values.

Figure 5:
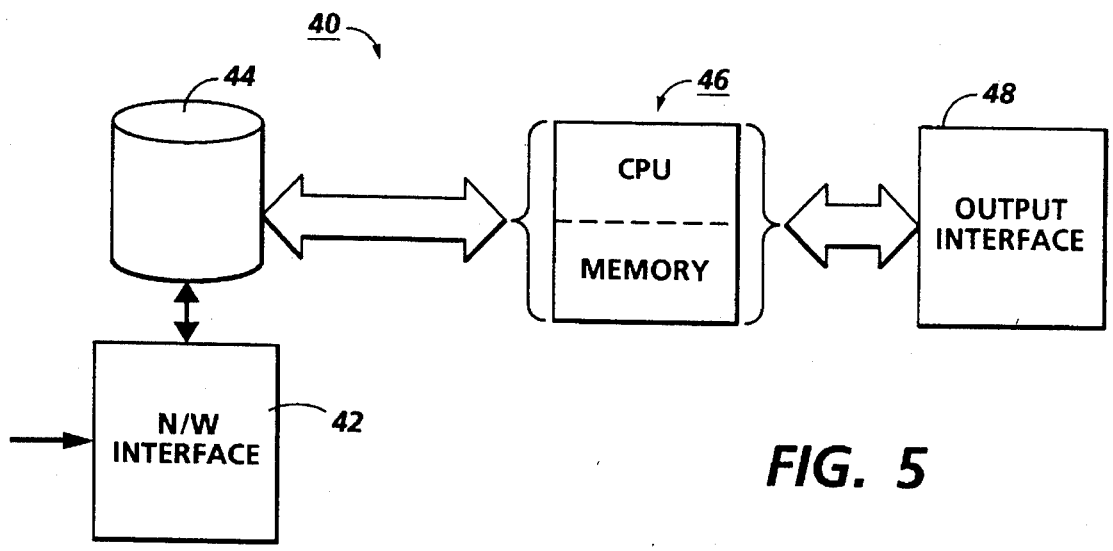
FIG. 5 is a block diagram of an apparatus which can be used to decompress compressed image data in accordance with the preferred decompressing technique.

Referring to FIG. 5, an apparatus for decompressing image data by way of the preferred technique, is designated by the numeral 40. The apparatus 40 includes a conventional network interface 42 coupled with a disk drive device 44 having an appropriate amount of memory capacity. The disk drive device communicates with a processor/page buffer arrangement 46. In the preferred embodiment, the processor comprises an 80960 risc processor. Additionally, the processor/page buffer arrangement communicates with an output interface 48, such as an image output terminal ("IOT") interface, for outputting the data stored in the memory of the processor/page buffer arrangement. In practice, the processor/page buffer arrangement 46 includes suitable code 50 (FIG. 6) for performing such functions as facilitating the output of data in conformance with the token values and image processing operations.

Figure 6:
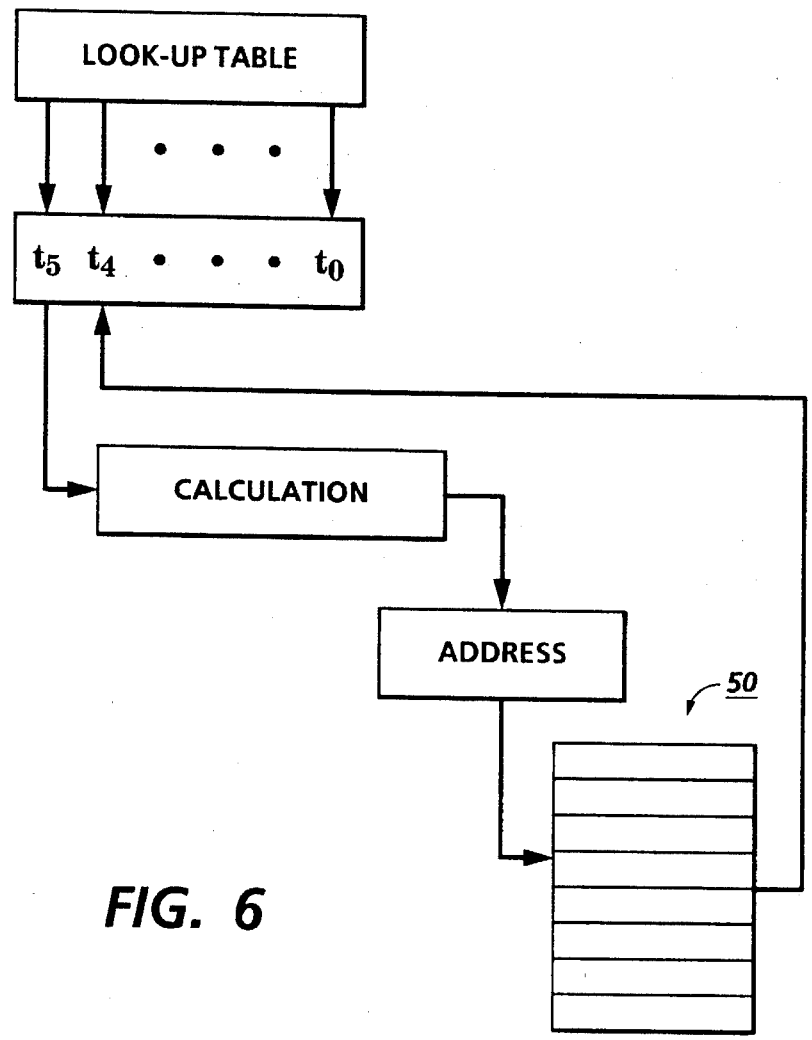
FIG. 6 is a schematic representation of a processing strategy used to implement the preferred decompressing technique.

Referring to FIGS. 5 and 6, the preferred approach for processing tokens of the look-up table is shown. In particular, a 16 bit word of compressed data is obtained by the processor from the disk drive device 44. The word is then used as an index into the look-up table and each of the tokens in the corresponding 32 bit word is transmitted serially to a calculation routine. As illustrated by FIG. 6, upon performing a calculation with a token, the process jumps (when assembly language is used) or switches (when C language is used) to a suitable address in the code 50. In one example, the formula assumes the following form:

$$\text{Address in Code} = c \text{ (Token Value)} + \text{(Code Label)}$$

where, c=Arbitrary Constant, and

Label=Constant Corresponding to Position in Code

In conjunction with the calculation routine, each token causes control to be passed to a selected address in the code where a predesignated action is performed on the output. After each token in the obtained 16 bit word has been processed, more data is obtained from the disk drive device and concatenated with the unused portion of the sixteen bit word to form a new sixteen bit word, and the process is continued until a desired amount of image data is processed.

Figure 7:
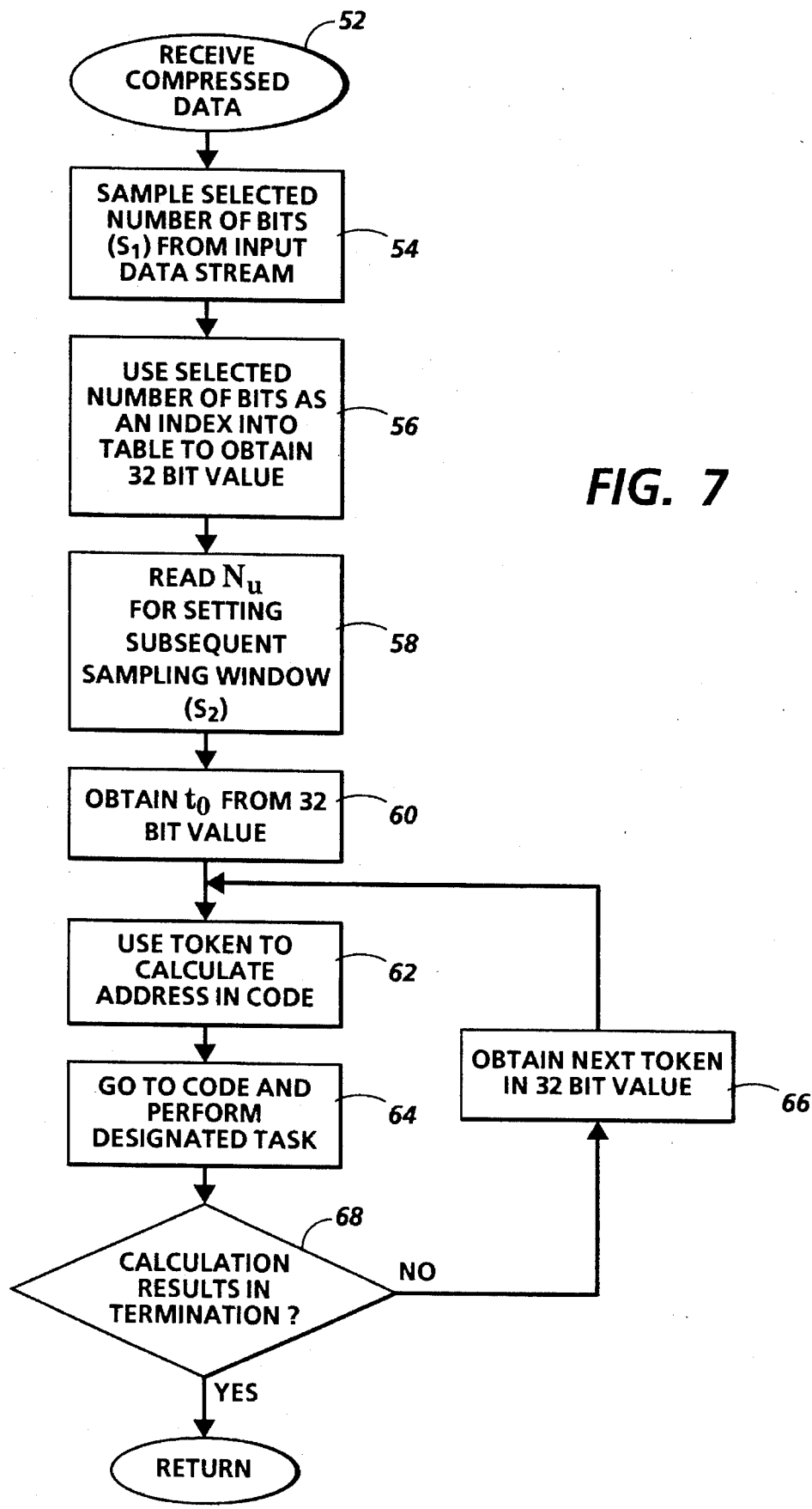
FIG. 7 is a flow diagram of an approach used to implement the strategy of FIG. 6.

Referring to FIGS. 7 and 8, the approach of FIGS. 5 and 6 is explained in further detail. In FIG. 8, unused bits are designated by the indicator "$N_u$" while bits representing a given token are shown in the form of "$N_{t_i}$". Initially, at step 52, compressed image data (hereinafter referred to as "input data stream") is received by way of the network interface 42 and stored in the disk drive device 44. To process the received image data, a selected number of bits ($S_1$) (16 bits in the preferred embodiment) is sampled from the input data stream (step 54). Per step 56, the sampled word is used as an index into the look-up table to designate one of the 32 bit values. With the designated 32 bit value a corresponding value of u is read (step 58) for initializing a second sampling window ($S_2$), as explained in further detail below.

Subsequent to reading u, the token $t_0$ is obtained, via step 60 from the second right-most field of the word 30 in FIG. 4A. With the value of $t_0$, an address is calculated with an appropriate formula of the type described above. This address represents a location in software suitable for performing one of a plurality of tasks on one or more pixels. In one instance, the task may require the outputting or processing of one or more pixels. Some examples of outputting one or more pixels are as follows:

If the token is a 1D token containing a run length, the previous entry in the change vector can be obtained and the run length value added thereto to produce the next entry in the change vector; or If the token is a 2D token, the previous scan line can be examined for finding the next changing position therein so that an appropriate action, such as adding an entry to the output vector from 3 positions to the left to three positions to the right of the position on the previous line, skipping the next two entries on the previous line or switching the look-up mode to 1D to force another look-up, can be taken.

It has been found that one advantageous way to perform image processing is to construct a scanline of pixels, in the form of a change vector and then perform appropriate image processing, e.g. resolution conversion and/or rotation on the pixels represented by the change vector. Alternatively, it may be desirable to perform image processing on more than one change vector at a time. Preferably, the process moves from the look-up table to a location in the suitable software 46 (FIG. 6) through such means as a jump table (for assembly language) or a switch-case statement (for C-language).

Upon performing a selected task in code (step 64), the next token is obtained, per step 68, from the 32 bit value, provided a return token (namely $t_r$) (FIG. 4A) has not been encountered. If the next-obtained token is not $t_r$, the process proceeds to step 66 for obtaining another another token. It is significant to understand that the processing procedure of FIG. 7 does not actually contain any decision making, a fact which serves to minimize the processing time of the preferred technique. It should be recognized that the decision diamond for step 68 is included merely for convenience of comprehension. More particularly, a calculation is performed for a given token by way of step 62 and if the token has a value other than $t_r$, then the process will increment the field for processing in the 32 bit value (i.e. the field of consideration will move from $t_i$ to $t_{i+1}$). If, on the other hand, the token has the value of $t_r$, then the calculation performed with $t_r$ will cause a jump or switch to a code location which causes further sampling of the input data stream.

When $t_r$ is encountered, the process returns, if necessary, to continue sampling the input data stream. Referring again to FIG. 8, the process accommodates for the unused bits, represented by $N_u$, by setting the beginning of the window $S_2$ at the end of the bits corresponding to the last-processed token, namely $N_{t_n}$ Referring to FIGS. 9A–9C and 10, a preferred approach for converting a run length of 8 white (or black) pixels into Xerox® compressed format is discussed. Referring specifically to FIGS. 9A, 9B and 9C, the process of constructing a change vector, representing a run length of 8 white pixels is explained. In the illustrated embodiment of FIG. 9A, two adjacent scanlines, designated by the numerals 72 and 74, one on top of the other, are shown. To construct a predictor scanline from the two scanlines, a pixel-by-pixel comparison is made. Where the pixels in the scanlines 72 and 74 are the same, a "0" is placed in the predictor scanline 76. On the other hand, where the pixels are different, a "1" is placed in the predictor scanline. It will be appreciated by those skilled in the art that the predictor scanline can be used to describe the scanline 74, provided that the binary values of scanline 72 are known, and the scanline 76, which has 5 run lengths can be described in a change vector more compactly than the scanline 74 which possesses 9 run lengths.

In Xerox® compressed format, a run length is described in terms of a run length indicator and a terminator flag. For Xerox® compressed format, a given image can be described by a table which includes an appropriate number of pairs, each pair including a run length indicator and a terminator flag. In the predictor scanline 76 of FIG. 9B, the run length pixels are represented by the nibbles 76a and 76b, while the terminator flag is represented by the nibble 76c. As will appear from the discussion of FIG. 10 below, it is necessary, in the presently described preferred method, to have the information of nibble 76d in order to obtain the value of the terminator flag 76c. Referring to FIG. 9C, the change vector, which can be obtained with any suitable software, including software based on the above-described technique for developing change vectors with an extended tree, includes four fields, designated respectively by the numerals 78a–78d. The fields describe the predictor scanline 76 cumulatively and alternate between black and white. That is, field 78a designates the presence of 9 consecutive white pixels, field 78b designates the presence of one black pixel, field 78c designates the presence of one white pixel and field 78d represents the presence of four consecutive black pixels.

Figure 10:
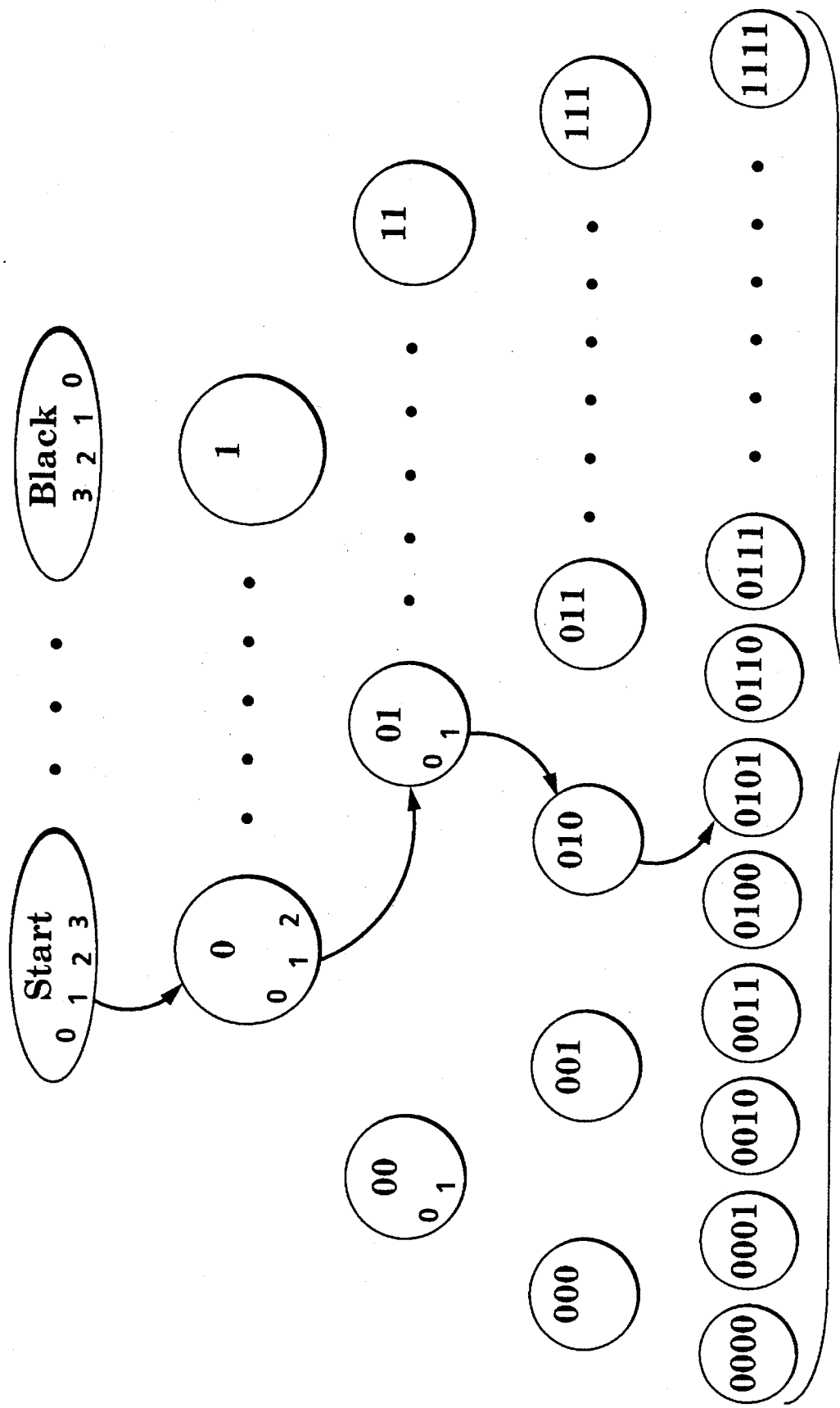
FIG. 10 is a state diagram employed to determine a terminator nibble for the change vector of FIG. 9C.

To determine the run length indicator ("RL") from the change vector, the field 78a is divided by four and the remainder is thrown out. Thus, the value of RL for change vector 78 is two. For obtaining the terminator flag, the state determination diagram of FIG. 10 is constructed. Preferably, the diagram includes thirty states which represent the manner in which 0 and 1 can be distributed in one, two, three and four bit words. While only 19 of the 30 states are actually shown in FIG. 10, the other 11 states can be obtained readily by analogy.

Referring to FIGS. 9C and 10 conjunctively, the procedure for obtaining the terminator flag 76c from the change vector 78 is discussed. Since the field 78a represents one white pixel in access of two nibbles of white pixels, it follows that the process for determining the terminator flag ("state process") begins at the left half of the diagram. Accordingly, the state process flows from the "Start" state to the "0" state. Since the field 78b indicates the presence of one black pixel, the state process then flows to the "01" state. In view of the 78c field, the terminator flag must include another white pixel, which white pixel follows the black pixel designated by field 78b. Since field 78d indicates the presence of three consecutive black pixels, the state process is required to flow from "010" to "0101". It is submitted that writing suitable code for implementing the state determining process described above is well within the purview of one familiar with the design of finite state machines.

In view of the above description, numerous features of the disclosed embodiments will be apparent to those skilled in the art: One feature of the preferred embodiment is that it maximizes the rate at which a stream of compressed input image data can be decompressed. In particular, the construction of an extended Huffman tree permits a plurality of tokens to be obtained with a single word sampled from the input data stream. Another feature of the disclosed embodiment is that it maximizes the rate at which tokens can be processed through a procedure in which decision making is minimized. In particular, each token is applied to a preset formula, and an address, corresponding to a location in predeveloped code, is determined. Processing of the token is achieved as result of accessing the predeveloped code at the determined location. Yet another feature of the disclosed embodiment is that image processing can be performed for compressed image data without decompressing the compressed image data completely. In one instance, image processing can be performed with one or more change vectors obtained from the compressed image data. As should be recognized, the rate of manipulating partially decompressed data exceeds the rate of manipulating fully decompressed data. Another feature of the disclosed embodiment is that image data can be converted from a first compressed format to a second compressed format without decompressing the image data of the first format completely. That is, the second compressed format can be obtained from a plurality of change vectors.

What is claimed is:

1. In an image processing system, including a processor and a device memory, a method of maximizing a rate at which image data in an input data stream is decompressed, comprising:

a) storing a look-up table in the device memory, the look-up table including a plurality of values, each value including a token and corresponding with one of a plurality of index words, the index words being derived from a balanced tree having a plurality of paths with each path being represented by a bit set, each path having the same length and each bit set being made up of an equal number of bits, each index word corresponding with one of the bit sets;

b) sampling the input data stream to develop a sample word having a length equal to each index word;

c) matching the sample word with one of the index words of the look-up table to access a corresponding value in the look-up table; and d) using the processor of the image processing system, decompressing a portion of the input stream, sampled with said b), by processing the token set of the corresponding value accessed with said c).

2. The method of claim 1, further comprising:

e) providing a tree portion with both a set of subpaths and a current set of nodes, each subpath being represented by one or more bits;

f) adding a copy of the tree portion to each current node to form extended subpath sets and a revised current node set;

g) if the number of bits in any extended subpath set is less than the number of bits in the bit set, adding a copy of the tree portion to each extended subpath set having a number of bits less than the bit set; and h) repeating said g) until the number of bits in all of the extended subpath sets is equal to or greater than the number of bits in the bit set, wherein each extended subpath set includes at least a set of bits corresponding with one of the plurality of paths.

3. The method of claim 1, in which the sample word includes N bits and u bits are unused during said d), further comprising:

e) sampling the input data stream to obtain (N–u) bits; and f) combining the (N–u) bits and the u bits to generate a new value for the sample word.

4. The method of claim 3, further comprising repeating said c) and d) with the sample word having the new value.

5. The method of claim 1, further comprising:

e) inserting the token set, obtained by way of said c), into a change vector.

6. The method of claim 5, in which the compressed image data is contained in a scan line of an image and the image data of the scan line includes multiple token sets, further comprising repeating said b), c) and e) until multiple token sets are contained within the change vector.

7. The method of claim 6, further comprising:

storing the change vector; and processing the image data of the scan line with the stored change vector.

8. The method of claim 1, further comprising providing a code set, with locations, for performing said d), wherein said d) includes accessing a selected one of the locations in the code set.

9. The method of claim 8, wherein said accessing the selected one of the locations in the code set includes calculating the position of the selected location with the token set obtained by way of said c).

10. The method of claim 9, further comprising providing the code set with a capability to perform image-related processing on the compressed image data portion.

11. In an image processing system, including a processor and a device memory, a method of processing compressed image data in an input data stream, the compressed image data corresponding with image data contained in a scanline with a plurality of pixels, comprising:

a) storing a look-up table in the device memory, the look-up table including a plurality of values, each value including a token set and corresponding with one of a plurality of index words, the index words being derived from a balanced tree having a plurality of paths with each path being represented by a bit set, each path having the same length and each bit set being made up of an equal number of bits, each index word corresponding with one of the bit sets;

b) sampling the input data stream to develop a sample word having a length equal to each index word;

c) matching the sample word with one of the index words of the look-up table to access a corresponding value in the look-up table;

d) wherein the token set, obtained by way of said c), is provided with information regarding a processing action to be taken with respect to the plurality of pixels; and e) using the processor of the image processing system, performing the processing action by processing the token set of the corresponding value accessed with said c).

12. The method of claim 11, further comprising inserting the token set, obtained by way of said c), into a change vector.

13. The method of claim 12, further comprising:

storing the change vector; and processing the image data of the scan line with the stored change vector.

14. The method of claim 11 further comprising providing a code set, with locations, for performing said e), wherein said e) includes accessing a selected one of the locations in the code set.

15. The method of claim 14, wherein said accessing the selected one of the locations in the code set includes calculating the position of the selected location with the token set obtained by way of said c).

16. The method of claim 15, further comprising providing the code set with a capability to perform image-related processing on the compressed image data portion.

17. The method of claim 11, further comprising providing the token set, obtained by way of said c), with information regarding a relative position of one of the plurality of pixels in the scan line.

18. The method of claim 11, wherein the processing action comprises an image-related processing action.

* * * * *